US012640900B2

(12) United States Patent
Zavalney et al.

(10) Patent No.: US 12,640,900 B2
(45) Date of Patent: May 26, 2026

(54) DELAY LINE MONITORING TO MAINTAIN A DATA EYE

(71) Applicant: Silicon Laboratories Inc., Austin, TX (US)

(72) Inventors: Paul Zavalney, Austin, TX (US); Tak Ying Wong, Singapore (SG); Harikrishnan Prabha Valsala, Singapore (SG); Pio Balmelli, Arogno (CH)

(73) Assignee: Silicon Laboratories Inc., Austin, TX (US)

( * ) Notice: Subject to any disclaimer, the term of this patent is extended or adjusted under 35 U.S.C. 154(b) by 120 days.

(21) Appl. No.: 18/591,061

(22) Filed: Feb. 29, 2024

(65) Prior Publication Data

US 2025/0279874 A1     Sep. 4, 2025

(51) Int. Cl.
*H04L 7/00* (2006.01)
*H03K 5/14* (2014.01)
*H03K 5/00* (2006.01)

(52) U.S. Cl.
CPC ............ *H04L 7/0033* (2013.01); *H03K 5/14* (2013.01); *H03K 2005/00078* (2013.01)

(58) Field of Classification Search
CPC . H03D 3/24; H03K 5/14; H03K 5/159; H03L 7/00; H03L 7/08; H04K 1/00; H04L 7/00; H04L 7/0033; H04L 25/00; H04L 27/14

USPC ....... 375/219, 229, 260, 267, 295, 316, 355, 375/373; 714/700, 704, 707
See application file for complete search history.

(56) References Cited

U.S. PATENT DOCUMENTS

| | | | | |
|---|---|---|---|---|
| 6,262,611 B1 * | 7/2001 | Takeuchi | .............. | H04L 7/0337 327/159 |
| 7,010,014 B1 * | 3/2006 | Percey | .................. | H03L 7/0814 327/158 |
| 7,281,176 B2 | 10/2007 | Eldredge | | |
| 7,512,203 B2 | 3/2009 | Eldredge et al. | | |
| 7,529,329 B2 * | 5/2009 | Popescu | .................. | H03L 7/091 327/147 |
| 7,577,224 B2 | 8/2009 | Eldredge | | |
| 7,609,798 B2 | 10/2009 | Eldredge et al. | | |
| 2004/0037572 A1 * | 2/2004 | Matsuyama | ....... | H04B 10/2513 398/208 |

* cited by examiner

*Primary Examiner* — Shawkat M Ali
(74) *Attorney, Agent, or Firm* — Trop, Pruner & Hu, P.C.

(57) ABSTRACT

In one aspect, an apparatus includes: a delay line to receive a clock signal and a plurality of settings, each of the settings to indicate a selected tap of the delay line at which to output the clock signal. The delay line is to output a capture clock based on a first setting, and monitor clocks based on additional settings. The apparatus also includes: a data sampler to sample incoming data with the capture clock and output capture data; monitor samplers to sample the incoming data with the monitor clocks and output monitored data; and a monitor circuit to trigger an update to at least one of the settings based on comparison of the capture data to the monitored data.

16 Claims, 10 Drawing Sheets

220

Late Monitor Trigger

230

Early Monitor Trigger

DELAY LINE MONITORING TO MAINTAIN A DATA EYE

BACKGROUND

High-speed digital interfaces, such as the Quad Serial Peripheral Interface (QSPI) or the Secure Digital Input Output (SDIO) interfaces, use a delay line to properly capture data. The delay line delays an interface clock to create a capture clock used to capture the data. This delay line is programmed either manually or through a training sequence to center the capture clock to a center of a data eye.

However, as temperature and voltage vary during operation, the delay line and the data itself can move relative to each other, causing the capture clock to move away from the center of the data eye. If this skew becomes too great, data are lost. Current mechanisms account for this problem by performing another training sequence. But such mechanisms can be complicated, consume power, and require a halting of data communication, which adversely affects performance.

SUMMARY OF THE INVENTION

In one aspect, an apparatus includes: a delay line comprising a plurality of taps, the delay line to receive a clock signal and a plurality of settings, each of the plurality of settings to indicate a selected tap at which to output the clock signal, where the delay line is to output a capture clock based on a first setting, a first monitor clock based on a second setting, and a second monitor clock based on a third setting; a data sampler to sample incoming data with the capture clock and output capture data; a first monitor sampler to sample the incoming data with the first monitor clock and output first monitored data; a second monitor sampler to sample the incoming data with the second monitor clock and output second monitored data; and a monitor circuit coupled to the first monitor sampler and the second monitor sampler, the monitor circuit to trigger an update to at least one of the plurality of settings based on comparison of the capture data to at least one of the first monitored data or the second monitored data.

In one implementation, the delay line comprises a plurality of delay lines, each of the plurality of delay lines comprising a plurality of taps. The monitor circuit may include a first comparator to compare the capture data to the first monitored data and trigger a first interrupt when the first monitored data does not match the capture data. The first comparator may be an exclusive-OR (XOR) gate to receive the capture data and the first monitored data, the XOR gate to output an active signal when the first monitored data does not match the capture data.

In an implementation, the monitor circuit may further include: a latch circuit to latch the active signal; and a synchronizer coupled to the latch circuit to send the first interrupt in response to the active signal. The apparatus may further include a controller coupled to the delay line, where in response to the first interrupt, the controller is to pause data communication and initiate a retraining. After the retraining, the controller is to provide at least one updated setting to the delay line.

In an implementation the delay line further comprises a control circuit to adjust one or more of the plurality of settings in response to a signal from the monitor circuit. The delay line may receive the clock signal comprising a selected one of a first clock signal or a strobe signal.

In another aspect, a method includes: receiving, in receiver circuitry of an integrated circuit, incoming data via a link; sampling the incoming data with: a capture clock to capture the incoming data as capture data; a first monitor clock to capture the incoming data as first monitored data; and a second monitor clock to capture the incoming data as second monitored data, where the capture clock, the first monitor clock and the second monitor clock are derived from a common clock signal provided to a delay line comprising a plurality of taps; and in response to a mismatch between the capture data and one of the first monitored data or the second monitored data, updating at least one configuration setting of the delay line.

In one implementation, the method further comprises in response to the mismatch between the capture data and the one of the first monitored data or the second monitored data, triggering an interrupt. The method may further include in response to the interrupt, retraining the link and thereafter updating the at least one configuration setting of the delay line. The method may further include in response to the mismatch between the capture data and the first monitored data, updating the at least one configuration setting of the delay line to cause the capture clock to move away from the first monitor clock. The method may further include in response to the at least one configuration setting of the delay line: outputting the capture clock from a first location of the delay line; outputting the first monitor clock from a second location of the delay line; and outputting the second monitor clock from a third location of the delay line.

In yet another aspect, an integrated circuit includes at one digital signal processor and an interface circuit. The interface circuit is configured to communicate with at least one device coupled to the integrated circuit via a link, and includes: a delay line to receive a clock signal and, based on plurality of configuration settings, output a capture clock, a first monitor clock, and a second monitor clock; a plurality of receivers coupled to the delay line, each of the plurality of receivers to receive a bit of a multi-bit communication and including: a data sampler to sample the bit with the capture clock and output a capture bit; a first monitor sampler to sample the bit with the first monitor clock and output a first monitored bit; a second monitor sampler to sample the bit with the second monitor clock and output second monitored bit; and monitor circuitry coupled to the first monitor sampler and the second monitor sampler to compare the capture bit to at least one of the first monitored bit or the second monitored bit. The integrated circuit may further include a controller coupled to the monitor circuitry, where in response to a mismatch between the capture bit and the at least one of the first monitored bit or the second monitored bit, the controller is to cause an update to at least one of the plurality of configuration settings.

In one implementation, the monitor circuitry comprises a first comparator to compare the capture bit to the first monitored bit and trigger a first interrupt when the first monitored bit does not match the capture bit. In response to the first interrupt, the delay line is to cause the capture clock to move with respect to at least one of the first monitor clock or the second monitor clock. The delay line may cause the capture clock to move with respect to the at least one of the first monitor clock or the second monitor clock without a retraining of the link.

In an implementation, in response to the first interrupt, the interface circuit is to perform a retraining of the link and the controller is to cause the update to the at least one of the plurality of configuration settings based at least in part on the retraining. The delay line, in response to the update to the at least one of the plurality of configuration settings of the delay line, is to cause the capture clock to move with respect to at least one of the first monitor clock or the second monitor clock.

DETAILED DESCRIPTION

In various embodiments, an interface circuit that receives incoming data includes or is coupled to a programmable delay line that is dynamically controlled during operation to ensure that a capture clock obtained via the delay line is maintained at least substantially in a center of a data eye of the incoming data. In this way, embodiments enable high speed operation of the interface circuit without the need for periodic training during operation, such as when operating conditions change, e.g., due to temperature and/or voltage changes.

As will be described herein, embodiments include monitor circuitry to monitor operation of a receiver to ensure that the capture clock is maintained within a substantial center of a data eye. To this end, multiple clock signals may be derived, e.g., via the delay line, to obtain multiple monitor clocks and the capture clock. Specifically, these monitor clocks, in an embodiment, include early and late clocks that are used to capture monitored data that is relatively early or late with respect to the capture data captured with the capture clock. The monitor circuitry uses these multiple monitor clocks to thus monitor operation of the receiver and ensure that the capture clock is maintained substantially within a center of a data eye.

Figure 1:
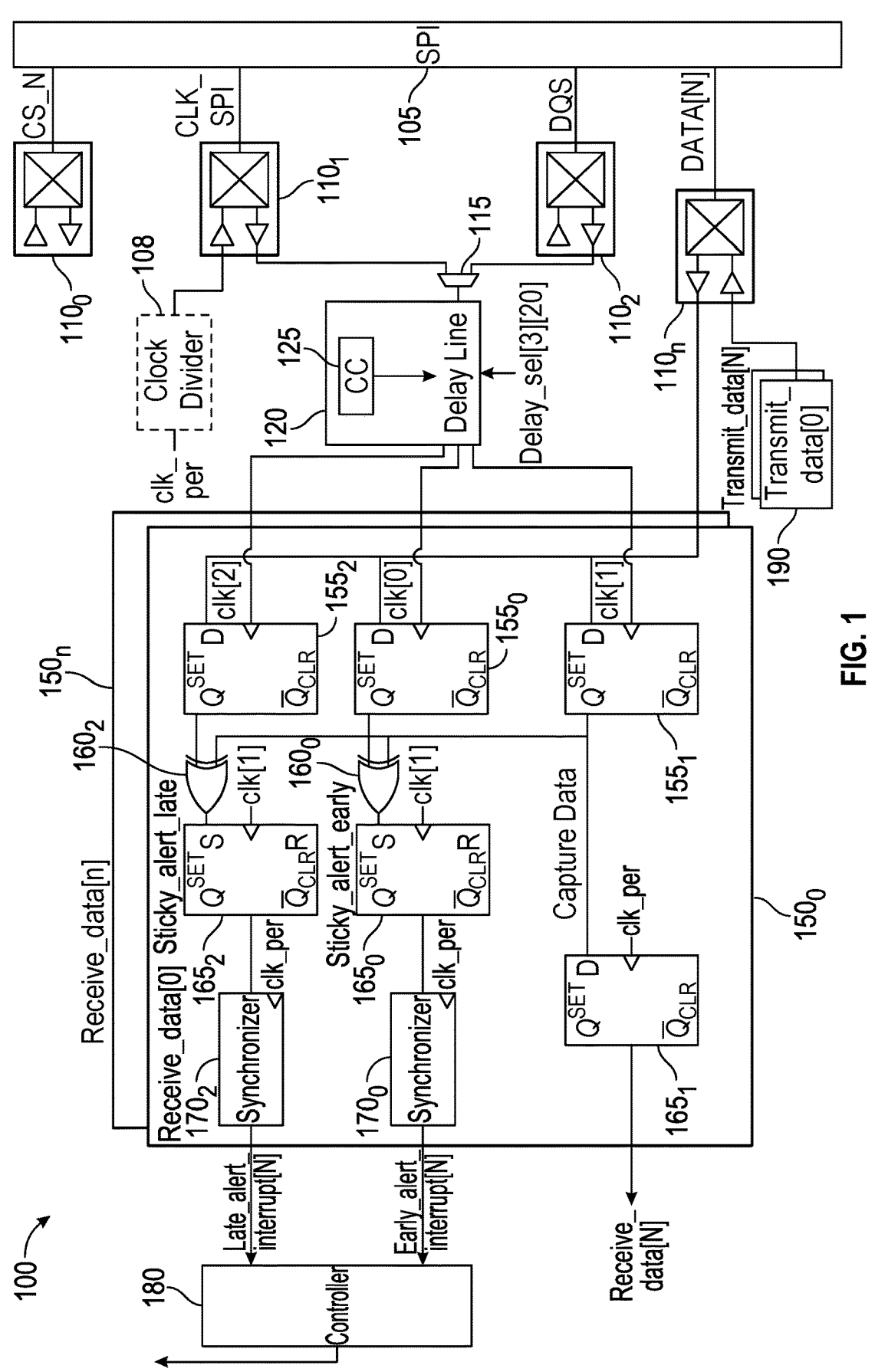
FIG. 1 is a schematic diagram of an apparatus in accordance with an embodiment.

Referring now to FIG. 1, shown is a schematic diagram of an apparatus in accordance with an embodiment. More specifically, as shown in FIG. 1, a monitor circuit 100 is a portion of an integrated circuit coupled to one or more devices by interface circuitry via which incoming data is received. Monitor circuit 100 is configured to monitor data around the capture clock, and alert an appropriate entity when the capture clock is to be moved (e.g., closer to a center of a data eye), to ensure data integrity. Embodiments having such a monitor circuit can reduce or eliminate the number of training sequences.

Although embodiments are not limited in this regard, as one example this interface circuit (including portions of FIG. 1) is part of SPI circuitry that couples the apparatus, which may be a system-on-chip (SoC) or other integrated circuit, with a slave device such as a memory (e.g., a non-volatile memory, random access memory or so forth).

In the high level view of FIG. 1, a link 105 (e.g., a SPI link) couples to the integrated circuit via interface circuitry. As shown, this interface circuitry includes various I/O pads $110_0$-$110_n$ and related transceiver circuitry (e.g., drivers and buffers). In FIG. 1, representative I/O pads include a chip select pad (CS) $110_0$ and multiple clock pads $110_{1,2}$ (including an SPI clock pad (CLK_SPI) and a data strobe signal (DQS)). In the embodiment of FIG. 1, an optional clock divider 108 may generate the SPI clock signal, e.g., using a divided version of a local oscillator clock signal. In addition, a representative data pad $110_n$ is illustrated to receive an incoming portion of a data communication (e.g., a single bitstream of a multi-bit communication, e.g., single bit, 4-bit, 8-bit, or 16 bit-wide data).

As shown, the incoming clock signals (CLK_SPI and DQS) couple through corresponding pads 110 and related receiver circuitry. A selected one of these signals is provided via a multiplexer 115 to a delay line 120. In embodiments herein, delay line 120 may be implemented as a multi-tap delay line having a plurality of taps. Although embodiments are not limited in this regard, in one implementation delay line 120 may be implemented as a 20-tap delay line. Also, while FIG. 1 shows an implementation having a single delay line with multiple programmable taps (to provide the three clocks), in other embodiments three separate delay lines may be used (although higher power may be incurred due to all delay lines toggling).

Suffice it to say, delay line 120 is programmably controlled to output multiple clock signals, namely the capture clock itself, and multiple monitor clocks (e.g., 2 monitor clocks), which as described herein are also referred to as an early clock and a late clock. To this end, delay line 120 includes a control circuit 125 that is configured to receive configuration settings (delay_sel[3][20], i.e., 3 settings each to identify a value between 1 and 20) to indicate location of the 3 clocks. More specifically, control circuit 125 uses these configuration settings to identify the location within taps of delay line 120 at which the corresponding clocks are taken. Thus based on delay line configuration settings, delay line 120 outputs these three clocks, namely the capture clock (shown in FIG. 1 as CLK[1]), and early and late monitor clocks (shown in FIG. 1 as CLK[0,2]) respectively.

A data receiver 150 couples to delay line 120. While details of a single data receiver $150_0$ are illustrated, understand that a corresponding data receiver is provided for each bit of a multi-bit interface.

As shown, data receiver 150 includes a plurality of data samplers $155_{1-2}$. In addition to a capture sampler $155_1$, there are a pair of monitor samplers $155_{0,2}$. As seen, each of monitor samplers 155 is provided with a different clock from delay line 120. More specifically, monitor sampler $155_0$ is provided with the early clock (CLK[0]), provided from an earlier portion of delay line 120 than the capture clock (CLK[1]) and thus is earlier in time than the capture clock. Similarly, monitor sampler $155_2$ is provided with the late clock (CLK[2]), provided from a later portion of delay line 120 than the capture clock and thus is later in time than the capture clock.

As further shown in FIG. 1, the outputs of monitor samplers $155_{0,2}$ are provided to respective exclusive-OR (XOR) gates $160_{0,2}$ which are further coupled to receive the capture data output from capture sampler $155_1$. As such, XOR gates 160 are configured to output a logic high signal (an active signal) when the capture data differs from the monitored data. In turn, these early and late indicator signals output from XORs 160 are provided to corresponding latches $165_{0,2}$ that are clocked by a negative edge of the capture clock (CLK[1]). As illustrated, latches 165 are implemented as set-reset (SR) latches, such that they operate in a sticky manner in that when set, they remain set until later reset. Latches $165_{0,2}$ in turn couple to synchronizers $170_{0,2}$.

Synchronizers 170 are configured to synchronize these early and late signals and output corresponding interrupt signals therefrom. In turn, the interrupt signals may be provided to a controller 180. Controller 180 may be any type of programmable circuitry that is configured to cause an update to (at least) the capture clock in response to an indication of an interrupt triggered by a mismatch between the capture data and one of the early or late monitored data. In one or more implementations, controller 180 may be a microcontroller to execute instructions stored in a non-transitory storage medium, or a finite state machine to execute in response to an interrupt.

Depending upon implementation, controller 180 may, in response to the interrupt, halt data communication and trigger a retraining of link 105. Understand that at the conclusion of such retraining, updated configuration settings are provided to delay line 120. In other implementations, controller 180 may be configured to automatically cause an update to the capture clock (and early and/or late clocks) by directly effecting a change to the configuration settings to move the capture clock away from the early clock in response to an interrupt triggered by a mismatch between the capture data and the early monitored data. Similarly, controller 180 may be configured to automatically update at least the capture clock by moving it away from the late clock in response to an interrupt triggered by a mismatch between the capture data and the late monitored data. Stated another way, if the early monitor is triggered, the delay line is incremented to move the capture clock away from the early data eye edge. Similarly, if the late monitor is triggered, the delay line is decremented to move the capture clock away from the late data eye edge. More generally, all of the capture, early and late clock delays can be moved together to re-center the data eye.

FIG. 1 further shows a transmitter 190 that is configured to transmit information via link 105. Understand while shown at this high level in the embodiment of FIG. 1, many variations and alternatives are possible.

Referring now to FIGS. 2A-2E, shown are timing diagrams illustrating operation of a data eye monitor in accordance with an embodiment. More specifically, each of these figures illustrates an arrangement with the set of capture and monitor clocks. Specifically, CLK[1] is the capture clock, CLK[0] is the early clock and CLK[2] is the late clock. Incoming data is captured by these clocks as, respectively, capture data, early data and late data. Note the comparison results output by XOR gates, namely a compare early output and a compare late output.

Figure 2A:
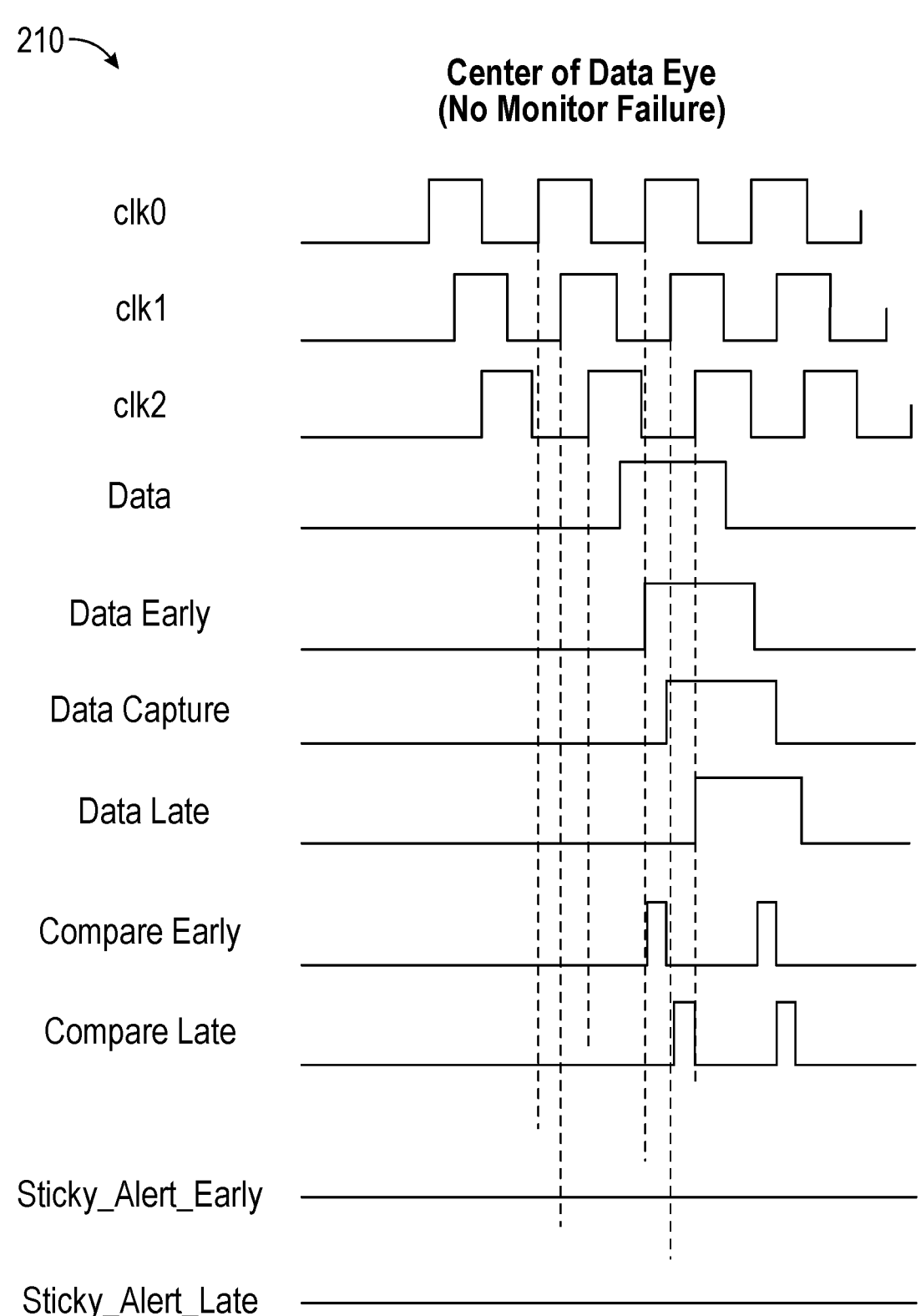
FIGS. 2A-2E are timing diagrams illustrating operation of an embodiment.
Figure 2B:
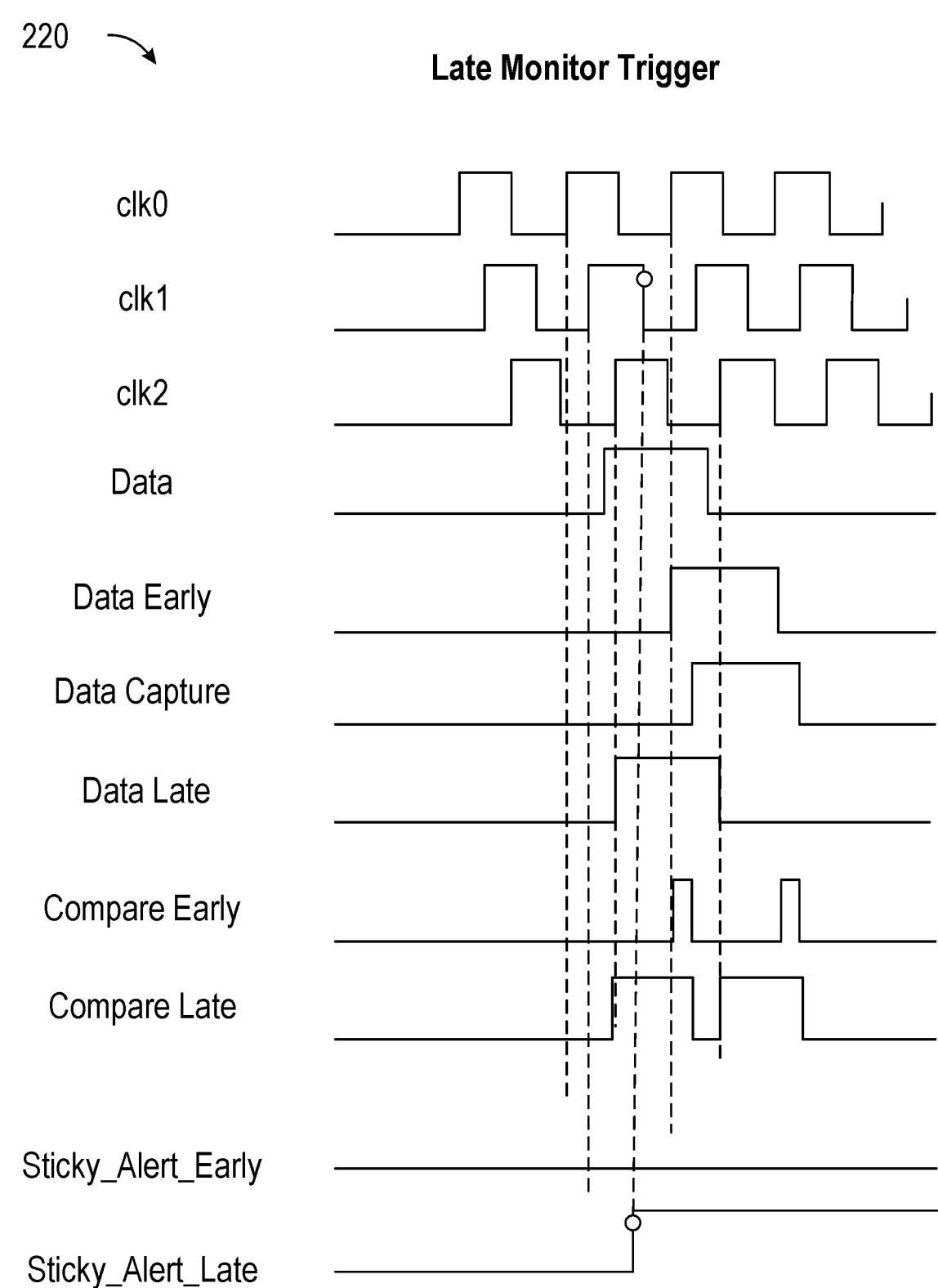
Figure 2C:
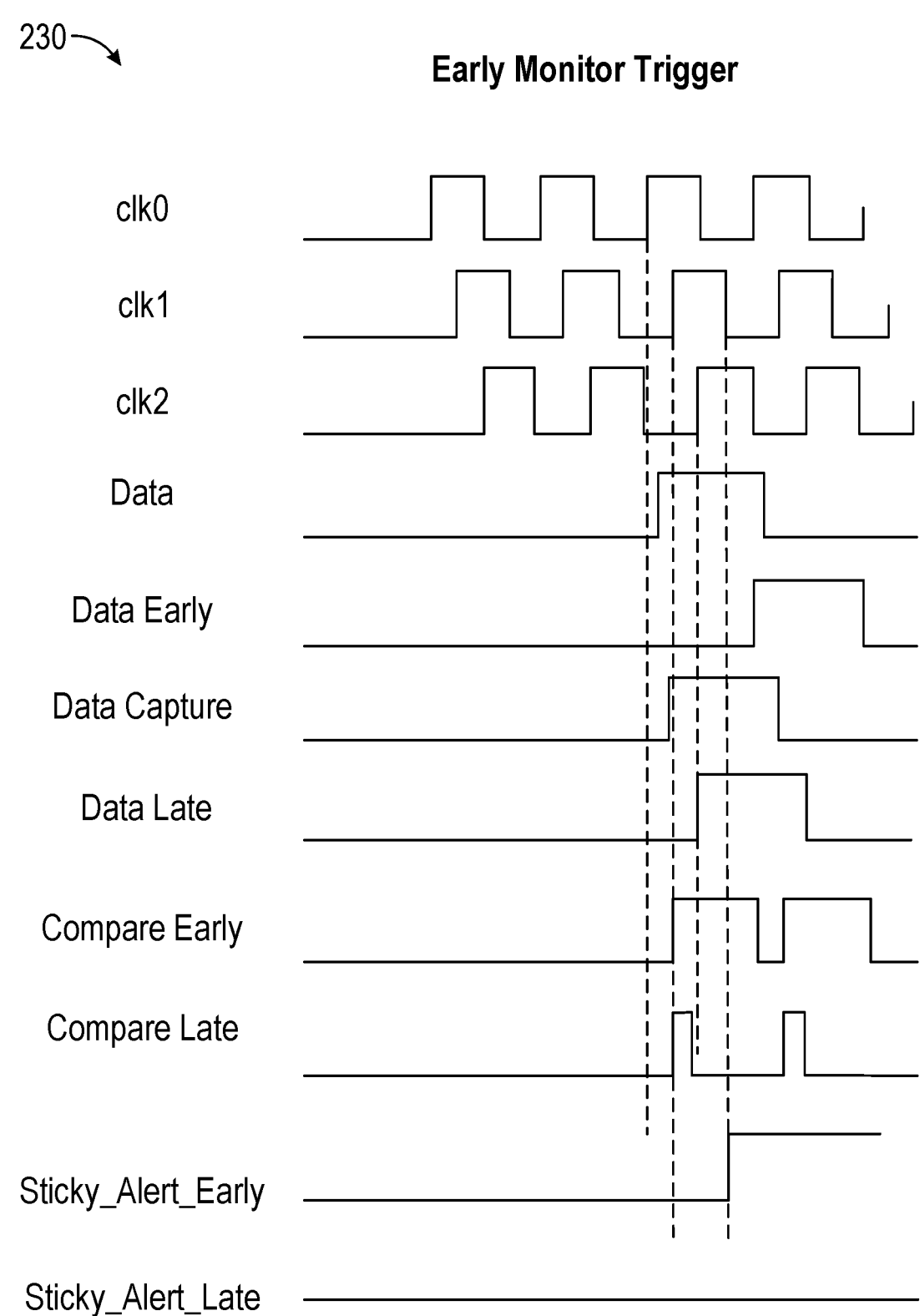

As shown in FIG. 2A in illustration 210, when the early and late data matches the capture data within the window of the capture data itself, the clocks are at appropriate phases with respect to each other, and thus there is no interrupt signal generated. In contrast, FIG. 2B illustration 220 demonstrates a situation in which the capture data and the late data do not overlap, and thus there is a mismatch determined in the XOR gate associated with the late clock. As such, the late interrupt signal is triggered that, in turn, causes an adjustment to at least the capture clock (e.g., away from the late clock). Similarly, FIG. 2C demonstrates in illustration 230 a situation in which the capture data and the early data do not overlap, and thus there is a mismatch determined in the XOR gate associated with the early clock. As such, the early interrupt signal is triggered that, in turn, causes an adjustment to at least the capture clock (e.g., away from the early clock).

Figure 2D:
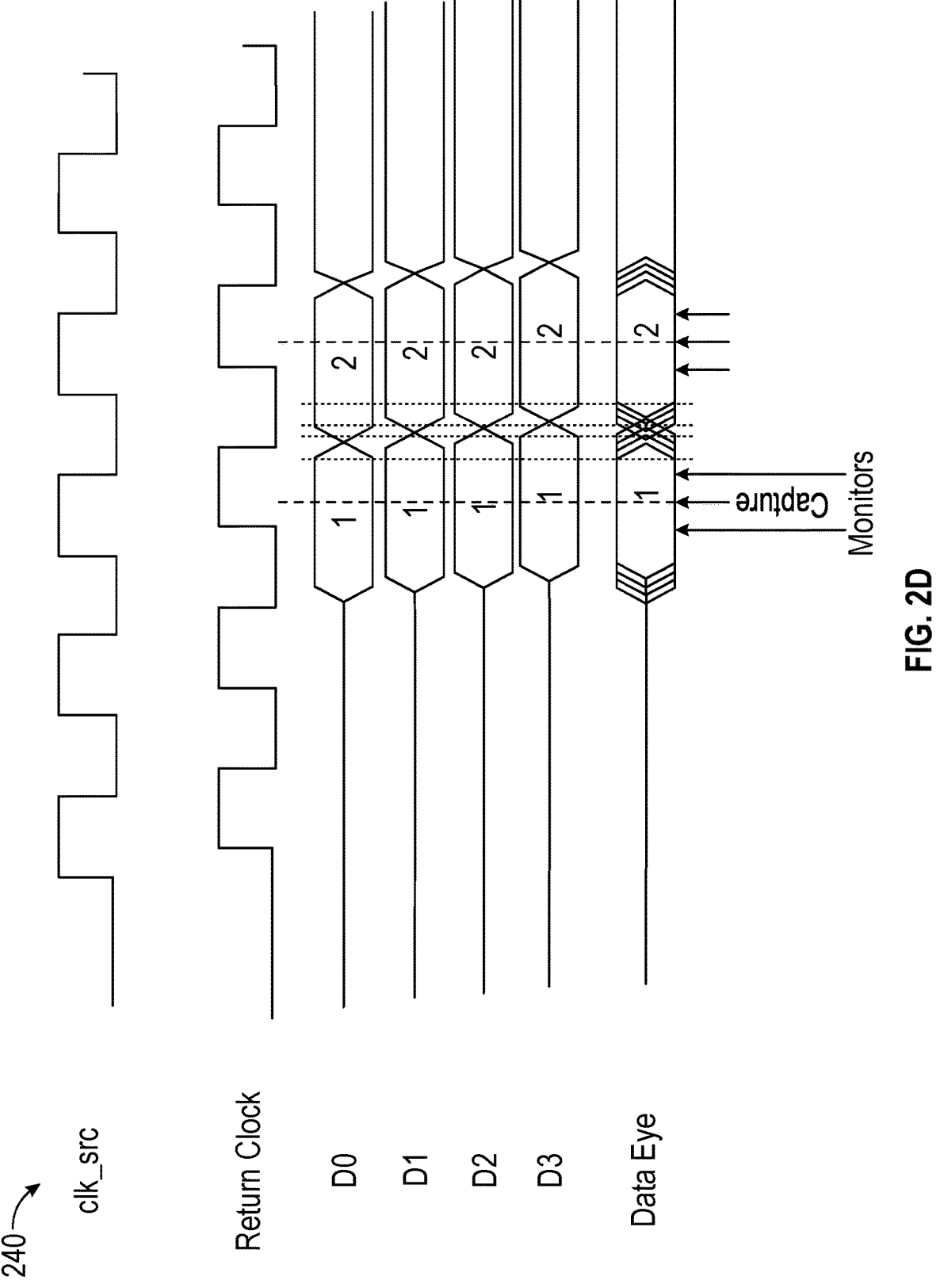
Figure 2E:
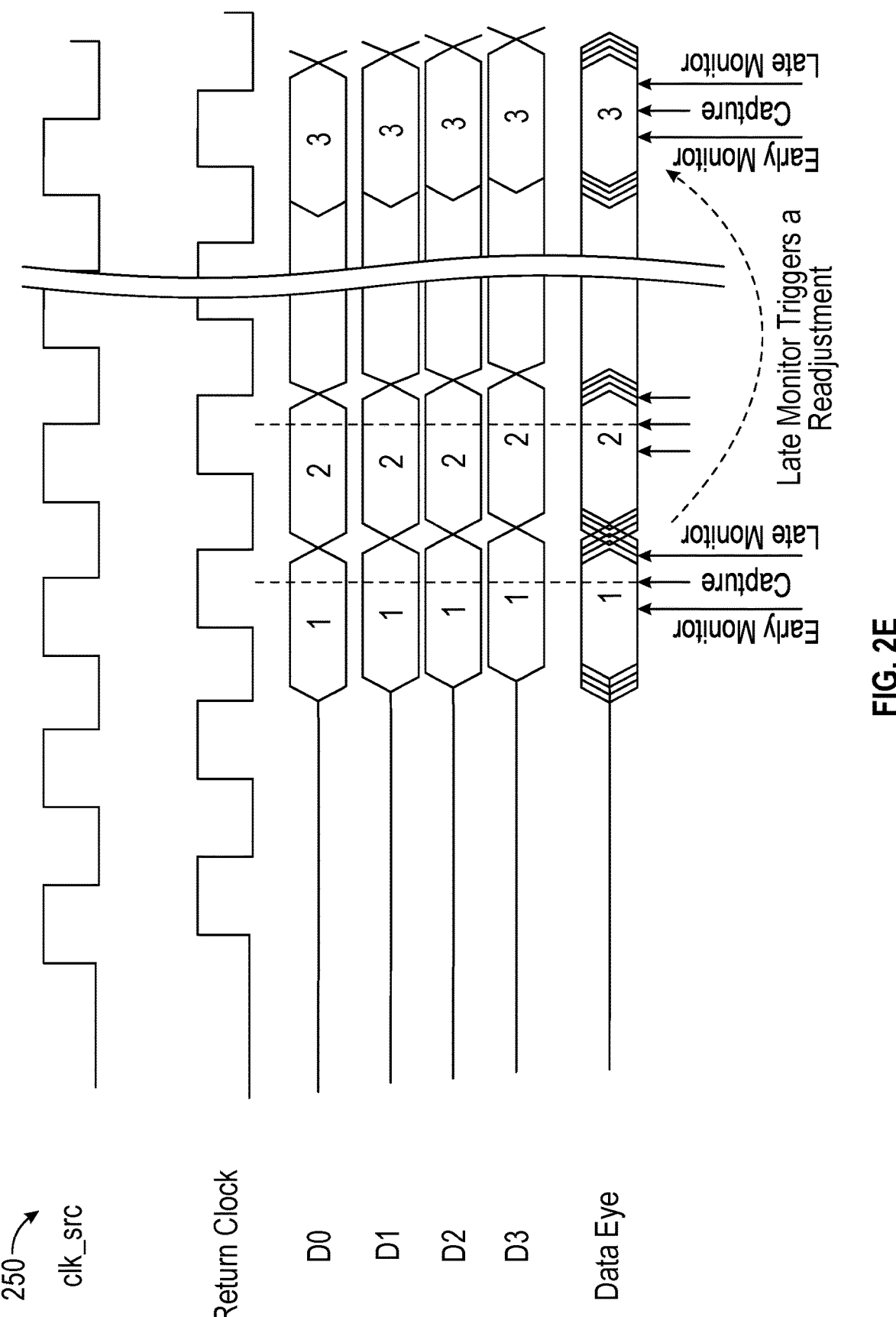

In FIG. 2D, incoming data over time is shown in which the data eye moves relative to the clock signals. In FIG. 2D, illustration 240 shows a situation in which the clocks are properly located in the center of the data eye, and thus correct data is captured using each clock. Turning next to FIG. 2E, illustration 250 shows a situation in which the late monitor clock causes monitored data to be captured outside the data eye, thus causing a mismatch with the capture data and triggering a readjustment. As shown, all three clocks are adjusted so that all fall within the data eye.

Figure 3:
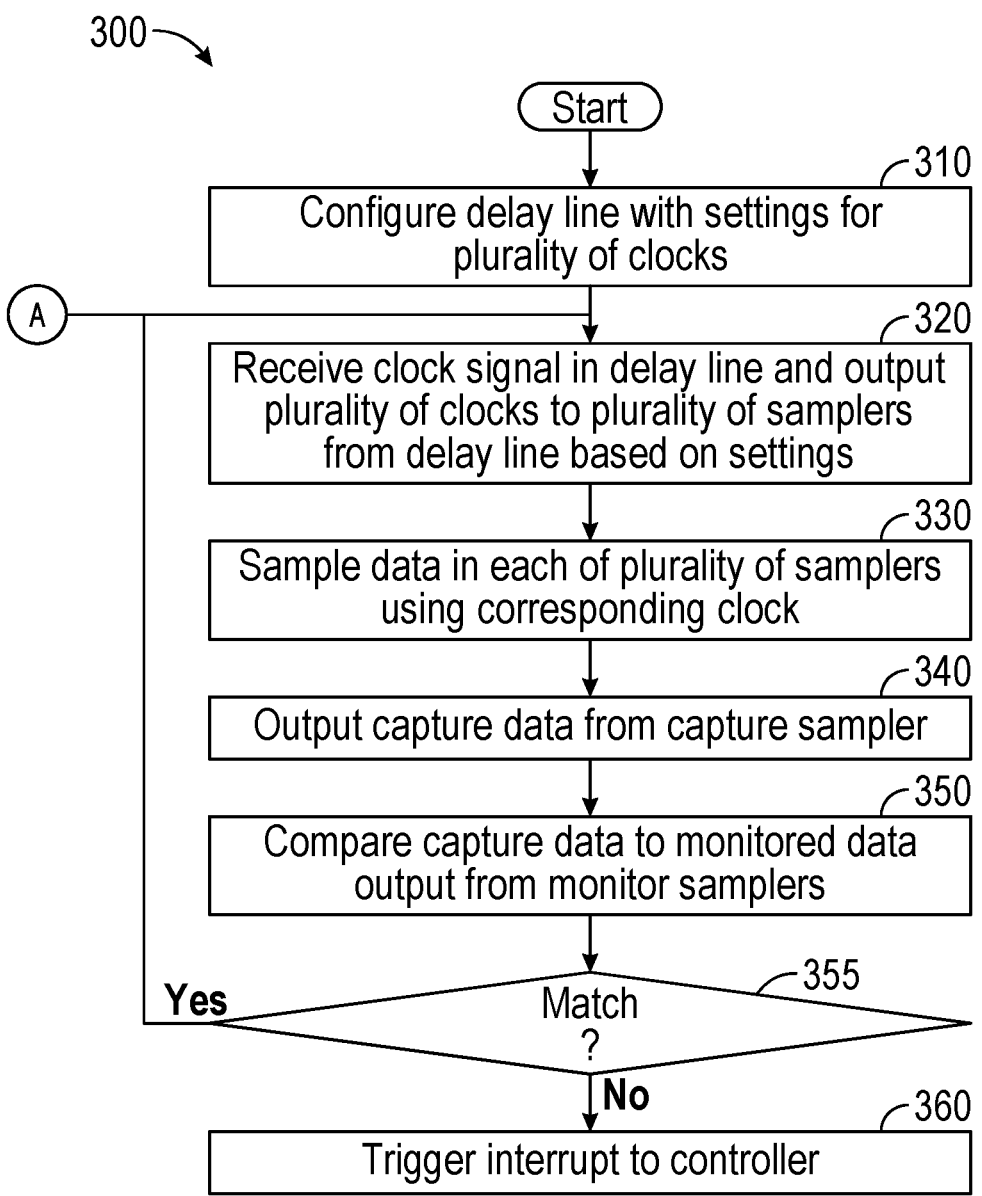
FIG. 3 is a flow diagram of a method in accordance with an embodiment.

Referring now to FIG. 3, shown is a flow diagram of a method in accordance with an embodiment. More specifically, FIG. 3 shows an arrangement in which a data eye monitor operates to detect a mismatch between monitored data and capture data and trigger some action based thereon. In the implementation of FIG. 3, this action may be an interrupt that causes a retraining or other operation to adjust link parameters. For example, the interrupt may cause the interface circuit to take another action, such as reducing communication frequency.

In one or more embodiments, method 300 may be performed by a controller or other programmable circuitry such as a finite state machine to execute instructions stored in a non-transitory storage medium. As shown, method 300 begins by configuring a delay line with settings for a plurality of clocks (block 310). In an embodiment, these configuration settings may be a plurality of control values, each to identify a location within the multi-tap delay line at which to obtain one of the clocks. At this point, normal operation of the data eye monitor begins. At block 320, a clock signal, e.g., a SPI clock in an SPI embodiment, is received in the delay line and the multiple clocks are output to their corresponding samplers based on the settings. Next at block 330, data of a data stream may be sampled in each of the samplers using the corresponding clock. At block 340, the capture data is output from the capture sampler and is sent for further processing in digital circuitry such as a digital signal processor.

In addition, the capture data is also provided for further use in monitoring the data eye. At block 350, the capture data is compared to the monitored data output from the monitor samplers. It is next determined at diamond 355 whether the comparisons result in a match. If so, the clocks are at appropriate locations and accordingly, control passes back to block 320 for further monitoring of the data eye with additional incoming data. Instead if it is determined that the comparisons do not result in a match, control passes to block 360, where an interrupt is triggered to the controller. As discussed above, the controller may, in turn, issue an interrupt to stop data communication and trigger a retraining of the link.

Figure 4:
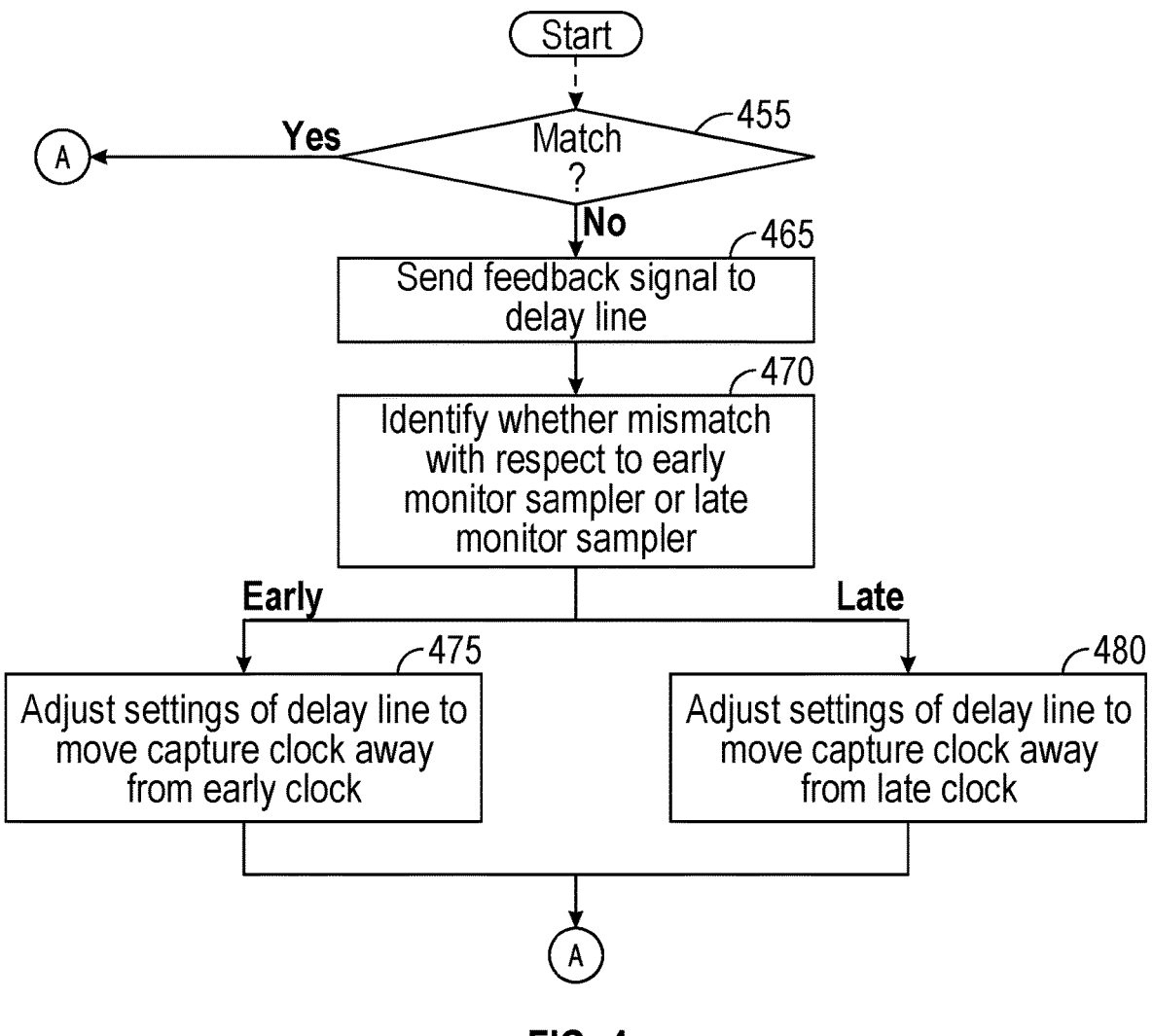
FIG. 4 is a flow diagram of a method in accordance with another embodiment.

In other implementations, it is possible to automatically cause an update to at least the capture clock, and in embodiments are described herein all three clocks, in response to a data mismatch. Referring now to FIG. 4, shown is a flow diagram of a method in accordance with another embodiment. In the embodiment of FIG. 4, operation proceeds the same as FIG. 3, to the point of identifying a mismatch at diamond 455 (thus preceded by blocks 310, 320, 330, 340, and 350, not illustrated in FIG. 4). When a mismatch is detected, control passes to block 465 where a feedback signal is sent to the delay line. This feedback signal may be the interrupt signal output from one of the synchronizers of the data eye monitor. Next at block 470, it is determined whether the mismatch is with respect to the early monitor sampler or the late monitor sampler.

If the mismatch is with respect to the early monitor sampler, at block 475 the settings of the delay line may be adjusted to move the capture clock away from the early clock (by adjusting the position of the capture, early, and late clocks). Instead, if the mismatch is with respect to the late monitor sampler, at block 480 the settings of the delay line may be adjusted to move the capture clock away from the late clock (by adjusting the position of the capture, early, and late clocks). After the adjustment of the configuration settings, further data eye monitoring occurs (such as shown at block 320 of FIG. 3). Note in this implementation, there is no retraining performed, thus reducing impact on high speed data communication, and reducing power consumption. Although shown at this high level in the embodiment of FIG. 4, many variations and alternatives are possible.

Figure 5:
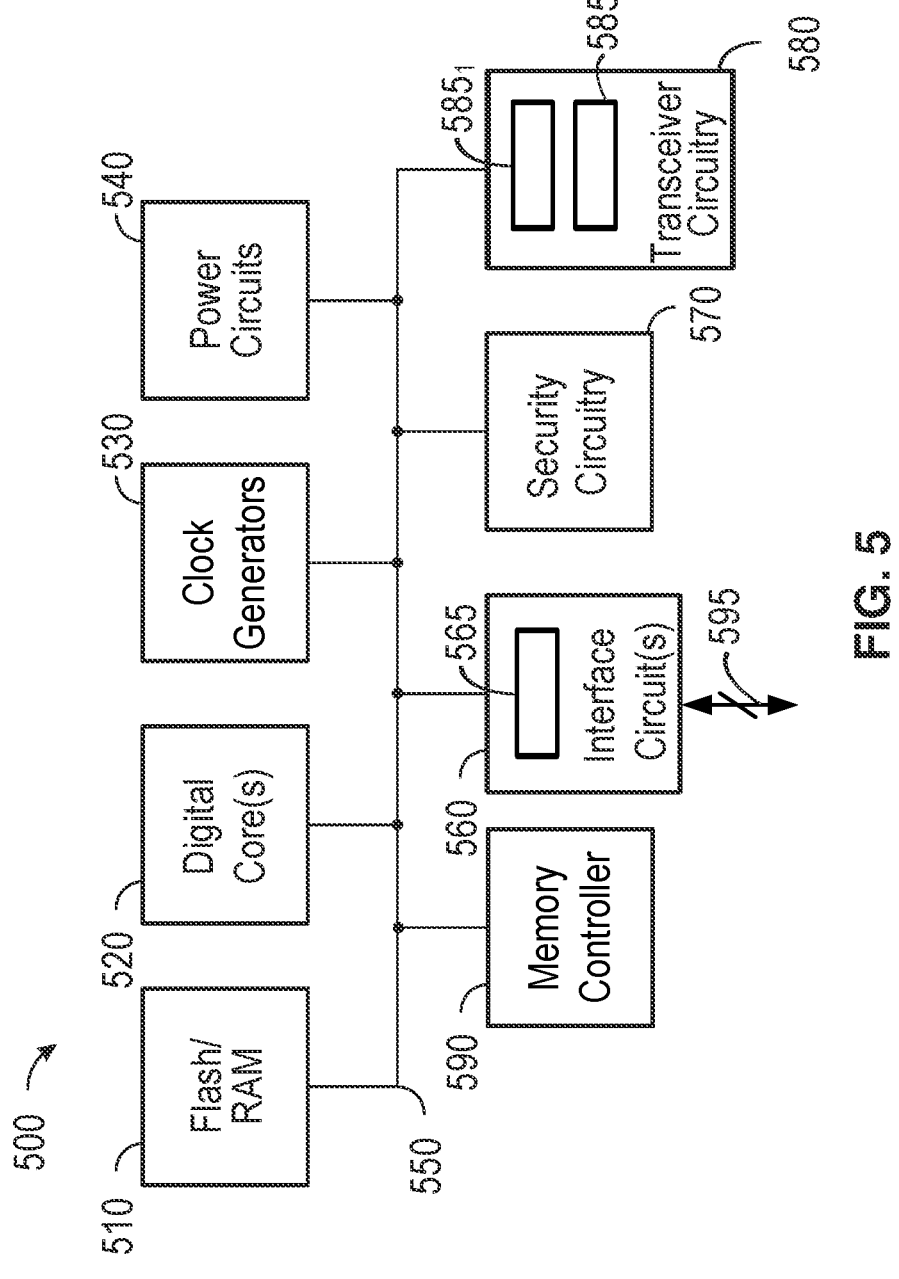
FIG. 5 is a block diagram of a representative integrated circuit that incorporates an embodiment.

Referring now to FIG. 5, shown is a block diagram of a representative integrated circuit 500 that includes circuitry to operate a delay line to provide multiple clocks that can be dynamically adjusted, as described herein. In the embodiment shown in FIG. 5, integrated circuit 500 may be, e.g., a dual mode wireless transceiver that may operate according to one or more wireless protocols (e.g., WLAN and Bluetooth, among others) or other device that can be used in a variety of use cases. In one or more embodiments, the circuitry of integrated circuit 500 shown in FIG. 5 may be implemented on a single semiconductor die.

Integrated circuit 500 may be included in a range of devices including a variety of stations, including smartphones, wearables, smart home devices, IoT devices, other consumer devices, or industrial, scientific, and medical (ISM) devices, among others.

In the embodiment shown, integrated circuit 500 includes a memory system 510 which in an embodiment may include volatile storage, such as RAM and non-volatile memory as a flash memory. The flash memory is a non-transitory storage medium that can store instructions and data. Such non-volatile memory may store instructions, including instructions for identifying a mismatch between data captured using a capture clock and monitor clocks, as described herein. As further shown integrated circuit 500 also may include a memory controller 590.

Memory system 510 couples via a bus 550 to one or more digital cores 520, which may include one or more cores and/or microcontrollers that act as processing units of the integrated circuit. In turn, digital cores 520 may couple to clock generators 530 which may provide one or more phase locked loops or other clock generator circuitry to generate various clocks for use by circuitry of the IC. In embodiments herein, this clock circuitry may generate a source clock from which capture and monitor clocks and be generated, as discussed above.

As further illustrated, IC 500 further includes power circuitry 540, which may include one or more voltage regulators. Additional circuitry may be present depending on particular implementation to provide various functionality and interaction with external devices. Such circuitry may include interface circuitry 560 which provides a digital communication interface with additional circuitry (such as a memory, to couple to IC 500 via a link 595), and which may include a controllable delay line 565, to output multiple clock signals used to monitor incoming data received via a link 595, as discussed herein. IC 500 also may include security circuitry 570 to perform wireless security techniques.

In addition, as shown in FIG. 5, transceiver circuitry 580 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. As shown, transceiver circuitry

580 includes multiple transceiver circuits $585_{1-n}$, to communicate according to multiple wireless communication protocols. Understand while shown with this high level view, many variations and alternatives are possible.

Figure 6:
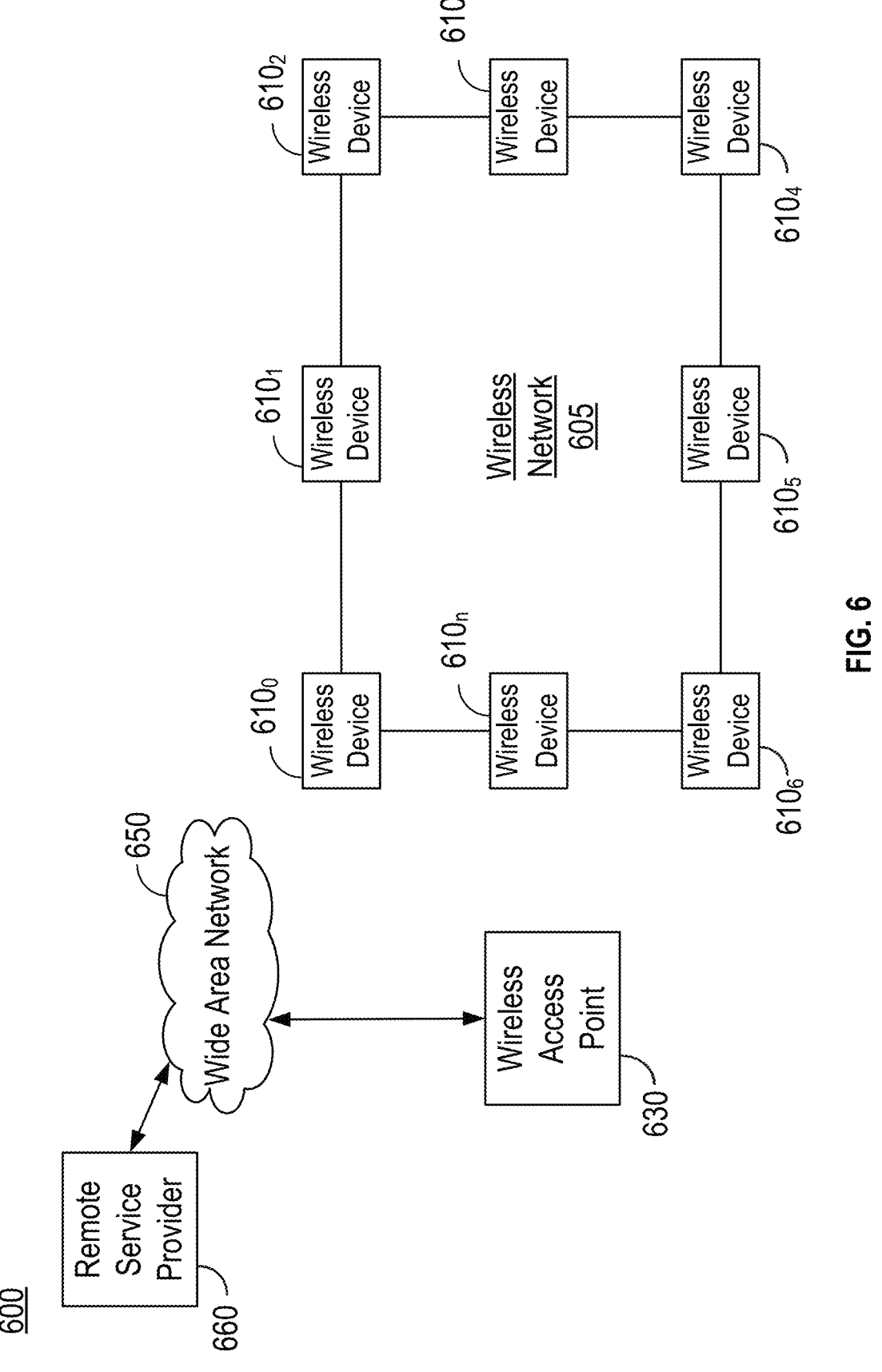
FIG. 6 is a high level diagram of a network in accordance with an embodiment.

ICs such as described herein may be implemented in a variety of different devices such as wireless stations, IoT devices or so forth. Referring now to FIG. 6, shown is a high level diagram of a network in accordance with an embodiment. As shown in FIG. 6, a network 600 includes a variety of devices, including wireless stations including smart devices such as IoT devices, access points and remote service providers, which may leverage embodiments for dynamically maintaining a capture clock and monitor clocks within a data eye as described herein.

In the embodiment of FIG. 6, a wireless network 605 is present, e.g., in a building having multiple wireless devices $610_{0-n}$. As shown, wireless devices 610 couple to an access point 630 that in turn communicates with a remote service provider 660 via a wide area network 650, e.g., the internet. Understand while shown at this high level in the embodiment of FIG. 6, many variations and alternatives are possible.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
   a delay line comprising a plurality of taps, the delay line to receive a clock signal and a plurality of settings, each of the plurality of settings to indicate a selected tap at which to output the clock signal, wherein the delay line is to output a capture clock based on a first setting, a first monitor clock based on a second setting, and a second monitor clock based on a third setting;
   a data sampler to sample incoming data with the capture clock and output capture data;
   a first monitor sampler to sample the incoming data with the first monitor clock and output first monitored data;
   a second monitor sampler to sample the incoming data with the second monitor clock and output second monitored data; and
   a monitor circuit coupled to the first monitor sampler and the second monitor sampler, the monitor circuit to trigger an update to at least one of the plurality of settings based on comparison of the capture data to at least one of the first monitored data or the second monitored data, wherein the delay line further comprises a control circuit, the control circuit to adjust one or more of the plurality of settings in response to a signal from the monitor circuit.

2. The apparatus of claim 1, wherein the delay line comprises a plurality of delay lines, each of the plurality of delay lines comprising a plurality of taps.

3. The apparatus of claim 1, wherein the monitor circuit comprises a first comparator to compare the capture data to the first monitored data and trigger a first interrupt when the first monitored data does not match the capture data.

4. The apparatus of claim 3, wherein the first comparator comprises an exclusive-OR (XOR) gate to receive the capture data and the first monitored data, the XOR gate to output an active signal when the first monitored data does not match the capture data.

5. The apparatus of claim 4, wherein the monitor circuit further comprises:

a latch circuit to latch the active signal; and a synchronizer coupled to the latch circuit to send the first interrupt in response to the active signal.

6. The apparatus of claim 5, further comprising a controller coupled to the delay line, wherein in response to the first interrupt, the controller is to pause data communication and initiate a retraining.

7. The apparatus of claim 6, wherein after the retraining, the controller is to provide at least one updated setting to the delay line.

8. The apparatus of claim 1, wherein the delay line is to receive the clock signal comprising a selected one of a first clock signal or a strobe signal.

9. A method comprising:

receiving, in receiver circuitry of an integrated circuit, incoming data via a link;

sampling the incoming data with:

a capture clock to capture the incoming data as capture data;

a first monitor clock to capture the incoming data as first monitored data; and a second monitor clock to capture the incoming data as second monitored data, wherein the capture clock, the first monitor clock and the second monitor clock are derived from a common clock signal provided to a delay line comprising a plurality of taps; and in response to a mismatch between the capture data and the first monitored data, triggering an interrupt and updating at least one configuration setting of the delay line to cause the capture clock to move away from the first monitor clock.

10. The method of claim 9, further comprising in response to the interrupt, retraining the link and thereafter updating the at least one configuration setting of the delay line.

11. The method of claim 9, further comprising in response to the at least one configuration setting of the delay line:

outputting the capture clock from a first location of the delay line;

outputting the first monitor clock from a second location of the delay line; and outputting the second monitor clock from a third location of the delay line.

12. An integrated circuit comprising:

at least one digital signal processor; and an interface circuit coupled to the at least one digital signal processor, the interface circuit to communicate with at least one device coupled to the integrated circuit via a link, the interface circuit comprising:

a delay line to receive a clock signal and, based on a plurality of configuration settings, output a capture clock, a first monitor clock, and a second monitor clock;

a plurality of receivers coupled to the delay line, each of the plurality of receivers to receive a bit of a multi-bit communication, each of the plurality of receivers comprising:

a data sampler to sample the bit with the capture clock and output a capture bit;

a first monitor sampler to sample the bit with the first monitor clock and output a first monitored bit;

a second monitor sampler to sample the bit with the second monitor clock and output a second monitored bit; and monitor circuitry coupled to the first monitor sampler and the second monitor sampler, the monitor circuitry to compare the capture bit to at least one of the first monitored bit or the second monitored bit; and a controller coupled to the monitor circuitry, wherein in response to a mismatch between the capture bit and the at least one of the first monitored bit or the second monitored bit, the controller is to cause an update to at least one of the plurality of configuration settings, and the delay line, in response to the update to the at least one of the plurality of configuration settings of the delay line, is to cause the capture clock to move with respect to at least one of the first monitor clock or the second monitor clock.

13. The integrated circuit of claim 12, wherein the monitor circuitry comprises a first comparator to compare the capture bit to the first monitored bit and trigger a first interrupt when the first monitored bit does not match the capture bit.

14. The integrated circuit of claim 13, wherein in response to the first interrupt, the delay line is to cause the capture clock to move with respect to at least one of the first monitor clock or the second monitor clock.

15. The integrated circuit of claim 14, wherein the delay line is to cause the capture clock to move with respect to the at least one of the first monitor clock or the second monitor clock without a retraining of the link.

16. The integrated circuit of claim 13, wherein in response to the first interrupt, the interface circuit is to perform a retraining of the link and the controller is to cause the update to the at least one of the plurality of configuration settings based at least in part on the retraining.

\* \* \* \* \*